(12) United States Patent
Min (10) Patent No.: US 11,480,624 B2
(45) Date of Patent: Oct. 25, 2022

(54) METHOD OF MEASURING DETERIORATION DEGREE OF BATTERY FOR ELECTRIC VEHICLE

(71) Applicants: HYUNDAI MOTOR COMPANY, Seoul (KR); KIA MOTORS CORPORATION, Seoul (KR)

(72) Inventor: Kyung-In Min, Seongnam-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 17/099,975

(22) Filed: Nov. 17, 2020

(65) Prior Publication Data

US 2022/0026500 A1 Jan. 27, 2022

(30) Foreign Application Priority Data

Jul. 21, 2020 (KR) .................. 10-2020-0090424

(51) Int. Cl.
*G01R 31/392* (2019.01)
*G01R 31/3842* (2019.01)
*B60L 58/16* (2019.01)

(52) U.S. Cl.
CPC ............ *G01R 31/392* (2019.01); *B60L 58/16* (2019.02); *G01R 31/3842* (2019.01); *B60L 2240/547* (2013.01); *B60L 2240/549* (2013.01)

(58) Field of Classification Search
None
See application file for complete search history.

(56) References Cited

U.S. PATENT DOCUMENTS

| 9,350,191 B2* | 5/2016 | Nomoto | H02J 7/007194 |
| 2004/0001996 A1* | 1/2004 | Sugimoto | G01R 19/16542 |
| | | | 429/61 |
| 2015/0185290 A1* | 7/2015 | Watanabe | G01R 31/392 |
| | | | 702/63 |

FOREIGN PATENT DOCUMENTS

| JP | 5849897 B2 | 2/2016 |
| KR | 10-2015-0109643 A | 10/2015 |
| KR | 10-1982938 B1 | 5/2019 |

* cited by examiner

*Primary Examiner* — Nasima Monsur
(74) *Attorney, Agent, or Firm* — Lempia Summerfield Katz LLC (57) ABSTRACT

A method of measuring a deterioration degree of a battery is provided for an electric vehicle. In particular, a Battery Management System (BMS) of a vehicle measures a deterioration degree of a battery by using a change amount of average values of voltage values measured at each current value point or a trend line connecting the average values of the voltage values in a predetermined current value section.

8 Claims, 6 Drawing Sheets

< ELECTRIC VEHICLE TRAVELLING 200,000Km -
HIGH CURRENT BAND OF -100 TO 100A >

< ELECTRIC VEHICLE TRAVELLING 200,000Km -
LOW CURRENT BAND OF -50 TO 50A >

FIG. 3C

< ELECTRIC VEHICLE TRAVELLING 50,000Km - HIGH CURRENT BAND OF -100 TO 100A >

FIG. 3D

< ELECTRIC VEHICLE TRAVELLING 50,000Km - LOW CURRENT BAND OF -50 TO 50A >

FIG. 4

METHOD OF MEASURING DETERIORATION DEGREE OF BATTERY FOR ELECTRIC VEHICLE

CROSS-REFERENCE TO RELATED APPLICATION

This application claims priority to and the benefit of Korean Patent Application No. 10-2020-0090424, filed on Jul. 21, 2020, the entire contents of which are incorporated herein by reference.

FIELD

The present disclosure relates to a method of measuring a deterioration degree of a battery for an electric vehicle, and more particularly, to a method of measuring a deterioration degree, in which a Battery Management System (BMS) of a vehicle measures a deterioration degree of a battery.

BACKGROUND

The statements in this section merely provide background information related to the present disclosure and may not constitute prior art.

Recently, a Hybrid Electric Vehicle (HEV) which travels by using driving force provided by an engine and a motor and an Electric Vehicle (EV) which travels by using driving force provided by a motor are used.

When a rapid acceleration is desired in the HEV or the EV, the motor and the engine provide together the torque desired for the acceleration in the HEV. In particular, the motor of the HEV supplements the driving force of the engine, whereas the motor of the EV solely provides the desired torque for the acceleration. In contrast to this, during deceleration of the vehicle, a regenerative braking function in both the HEV and the EV is implemented to charge a battery.

The battery is chemically consumed unlike the mechanical components, so that as hours of use are increased, the total capacity of the battery decreases, that is, a battery deterioration phenomenon is generated.

The deterioration of the battery negatively affects performance of the vehicle, such as a decrease in a possible driving distance of the vehicle and a decrease in engine output for acceleration, and when the vehicle is operated in the state where the negative affect due to the deterioration of the battery is not reflected, the battery may be discharged even though the vehicle travels less than the possible driving distance displayed on a gauge of the vehicle.

Accordingly, in order to measure a deterioration degree of the battery, the technology of the apparatus for estimating a battery state measures a deterioration degree of a battery by using an inclination of impedance for each temperature corresponding to each State Of Charge (SOC) of the battery.

However, we have discovered that the technology uses a method of obtaining a graph by applying various frequency components to a battery for measuring impedance, and the application of the fixed frequency by the vehicle is technically very difficult, and it is possible to measure impedance during charging or only under a specific condition, so that the deterioration degree is inaccurately measured.

SUMMARY

The present disclosure provides a method of measuring a deterioration degree of a battery for an electric vehicle, which accurately measures deterioration of a battery, thereby reducing or removing a driving distance error during an operation of the vehicle.

An exemplary form of the present disclosure provides a method of measuring a deterioration degree of a battery for an electric vehicle, in which a Battery Management System (BMS) of a vehicle measures a deterioration degree of a battery by using a change amount of average values of voltage values measured at each current value point or a trend line connecting the average values of the voltage values in a predetermined current value section.

In one form of the present disclosure, the method of measuring a deterioration degree of a battery for an electric vehicle measures a deterioration degree of a battery according to a change amount of average values of voltage values generated at each output current point of the battery and an inclination of the trend line, thereby easily recognizing a deterioration state of the battery through a relatively simple algorithm, measuring a deterioration degree in real time even during travelling, and being suitable to be applied to an embedded system.

It is also possible to efficiently manage a life of a battery of a vehicle according to a recognized deterioration degree of the battery, and enable an Electronic Control Unit (ECU) of a vehicle to notify a user of a possible driving distance to which the recognized deterioration degree of the battery is reflected, thereby improving a commercial value of the vehicle and preventing consumer complaints.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Hereinafter, a configuration of a method of measuring a deterioration degree of a battery for an electric vehicle of the present disclosure will be described in detail with reference to the drawing.

However, the disclosed drawings are provided as an example for sufficiently delivering the spirit of the present disclosure to those skilled in the art. Accordingly, the present disclosure is not limited to the drawings presented below and may also be specified in another aspect.

Unless otherwise defined in terms used in the specification of the present disclosure, the terms have the meanings commonly understood by those skilled in the art, and in the following description and the accompanying drawings, detailed explanation of known related functions and constitutions may be omitted to avoid unnecessarily obscuring the subject matter of the present disclosure.

Figure 1:
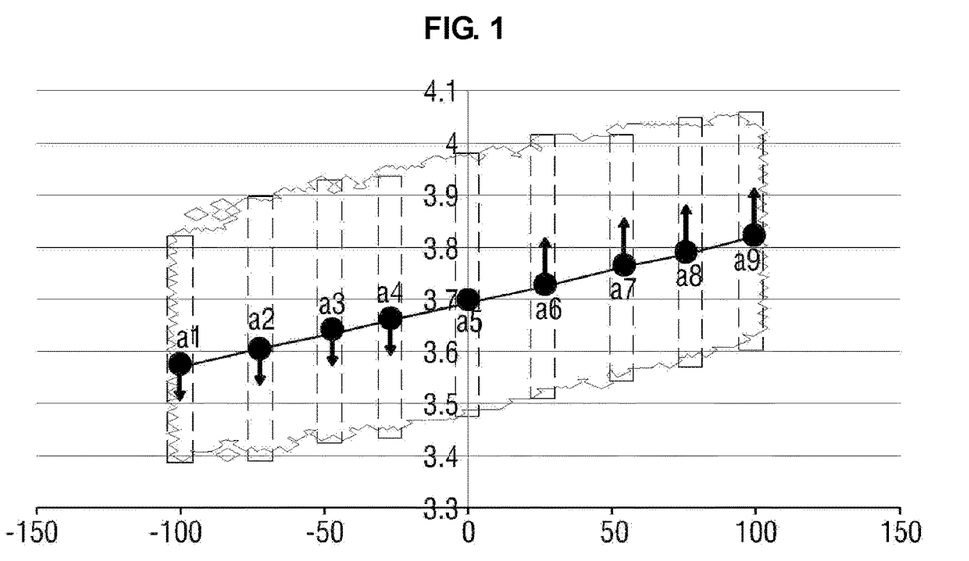
FIG. 1 is a diagram illustrating an example of a graph representing an output voltage of a battery for an electric vehicle.

FIG. 1 is a diagram illustrating an example of a graph representing an output voltage of a battery for an electric vehicle in one form of the present disclosure.

Referring to the drawing, a method of measuring a deterioration degree of a battery for an electric vehicle in one form of the present disclosure measures a voltage value to a current value of a battery, and measures a deterioration degree by using a change amount of average values of the measured voltage values or an inclination of a trend line connecting the average values.

The graph of the drawing is the graph of an output voltage corresponding to an output current value of the battery during travelling of the electric vehicle, and an x-axis of the graph is a current value and a y-axis of the graph is a voltage value.

Herein, a negative region of the current value in the x-axis is a region in which the battery is discharged, and a positive region in the x-axis is a region in which the battery is charged.

In this case, the voltage values corresponding to points a1, a2, a3, a4, a5, a6, a7, a8, and a9 in the graph represent average values of the voltage values measured in a corresponding current value for a predetermined time, and as the battery deteriorates, the average value of the voltage values decreases in the negative region of the current value, and increases in the positive region of the current value.

A method of measuring a deterioration degree according to a first exemplary form of the present disclosure measures a deterioration degree of a battery by using a change amount of an increase or a decrease in the average value of the voltage values.

In one form of the present disclosure, a Battery Management System (BMS) of the electric vehicle divides a section of an output current value of the battery by a predetermined interval, measures a voltage value at each divided current value point for a predetermined time and obtains data of the voltage values, and then calculates a first average voltage value (V_avg(t)) of the voltage values obtained at a first time point (t) at which the number of obtained data is larger than a predetermined number.

Then, the BMS calculates a second average value (V_avg (t+1)) of the voltage values obtained at a second time point (t+1) at which the number of obtained data is larger than the predetermined number by obtaining the data of the voltage values again, calculates a change amount of the average voltage value by computing a difference between the first average voltage value (V_avg(t)) and the second average voltage value (V_avg(t+1)), and measures a deterioration degree of the battery by using the calculated change amount.

In the first exemplary form of the present disclosure, in order to measure a deterioration degree of the battery according to the change amount of the average voltage value, a value of the deterioration degree (hereinafter, referred to as a "deterioration level value) corresponding to the calculated change amount of the average voltage value is stored in a data table to which the BMS refers in advance, and the BMS reads the deterioration level value matched with the corresponding change amount in the data table and measures a deterioration degree of the battery in a current state.

Next, a second exemplary form of the method of measuring a deterioration degree of a battery present disclosure will be described.

The second exemplary form of the method of measuring a deterioration degree of the battery calculates a deterioration degree of a battery by using a trend line of an average value of the voltage values.

That is, the BMS of the electric vehicle divides a section of an output current value of the battery by a predetermined interval, measures a voltage value at each divided current value point for a predetermined time and obtains data of the voltage values, and then calculates an average value of the measured voltage values and draws a trend line of the calculated average values of the voltage values, and calculates a deterioration degree by using an inclination of the drawn trend line.

Figure 2:
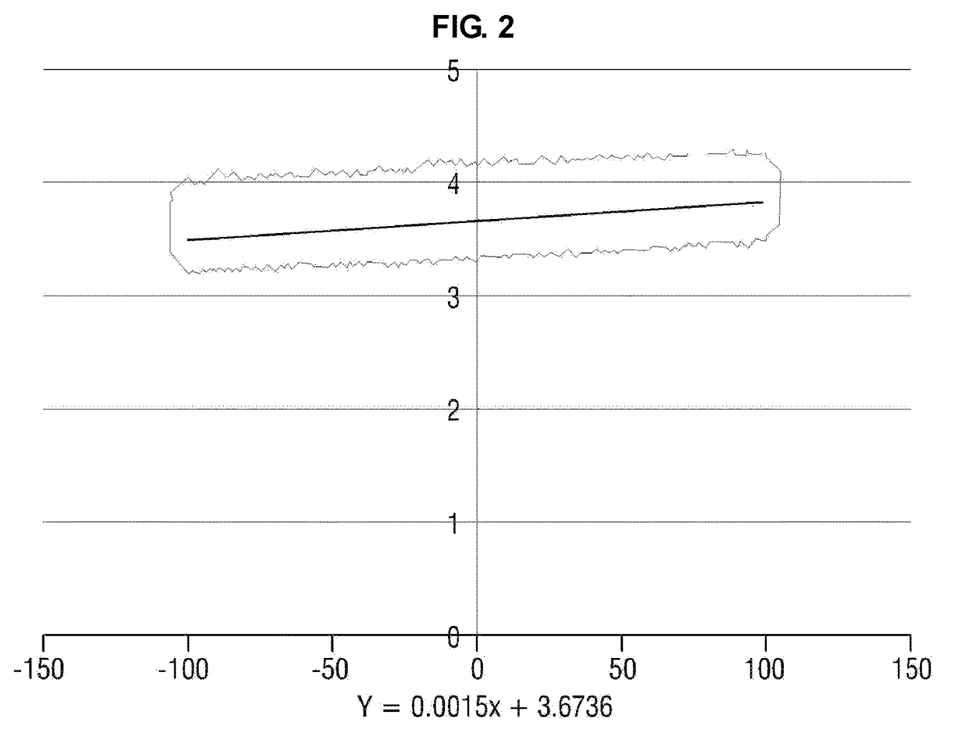
FIG. 2 is a diagram illustrating an example of a trend line of an output voltage of a battery for an electric vehicle.

FIG. 2 is a diagram illustrating an example of a trend line of an output voltage of a battery used in the method of measuring a deterioration degree of a battery in one form of present disclosure.

The illustrated trend line of the exemplary form may be a cluster line of average value data drawn by connecting the average values of the voltage values measured at each current value point divided by the predetermined interval.

In this case, the voltage values in a vertical axis to a current value in a horizontal axis forming the trend line are values represented by Equation 1 below, and it can be seen that the value represents a resistance value of the battery and an inclination of the trend line is a resistance value of the battery.

$$R = V/I \qquad \text{Equation 1:}$$

where, *R: Resistance,

*V: Voltage, and

*I: Current

In the example of FIG. 2, a function of the trend line is Y=0.0015x+3.6736, in which a value of 0.0015 represents an inclination of the trend line, and the value of the inclination is a resistance value of the battery, and it means that as the resistance value is larger, the deterioration degree of the battery is great.

Accordingly, the method of measuring the deterioration degree of the battery in the second exemplary form of the present disclosure uses the characteristic that as the inclination of the trend line increases, the deterioration degree of the battery increases, and a value of the deterioration degree (hereinafter, referred to as a "deterioration level value) corresponding to the inclination of the trend line is stored in a data table to which the BMS refers in advance, and when the trend line of the battery is drawn, the BMS reads the deterioration level value matched with the inclination of the corresponding trend line in the data table and measures a deterioration degree of the battery in a current state.

Herein, in the methods of measuring the deterioration degree according to the first and second exemplary forms, as a current value sensed by a current sensor sensing an output current of the battery increases, an error may increase, so that it is desired to set a section of the current value for obtaining an average value of the voltage value to a section in which the current is most used during an operation of the electric vehicle.

For example, when it is assumed that the section in which the corresponding electric vehicle uses the most current during an operation is −50A to +50A, the section is designated as the section for calculating an average value of the voltage values, and when the section at which the voltage value is to be measured is divided by an interval of 10A, respective points for measuring the voltage value are −50A, −40A, −30A, −20A, −10A, 10A, 20A, 30A, 40A, and 50A, and the BMS measures voltage values at the points for a predetermined time and calculates an average value of the measured voltage values, and then, measures a deterioration degree by using a change amount of the calculated average value or draws a trend line of the calculated average values to measure a deterioration degree like the exemplary form of the present disclosure.

Figure 3A:
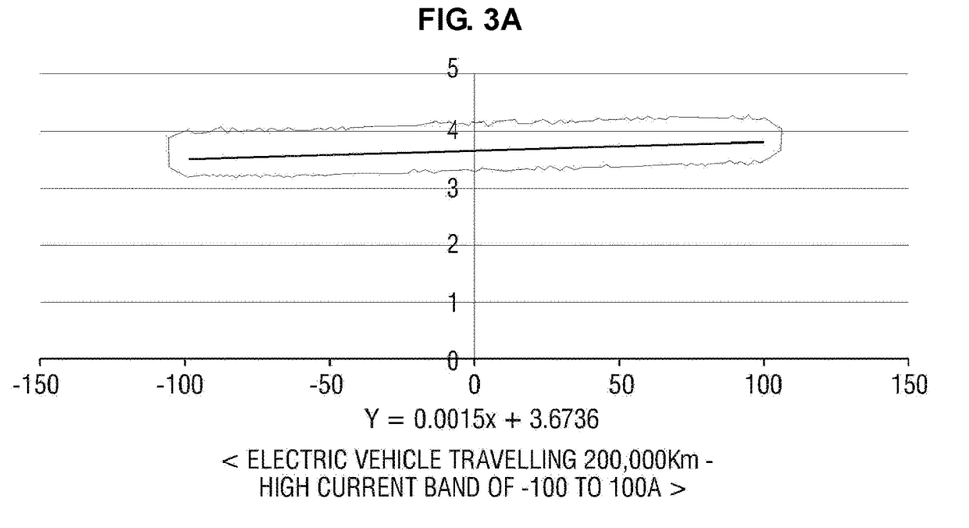
FIG. 3A illustrates a trend line of a high current band of a long-distance travelling vehicle.
Figure 3B:
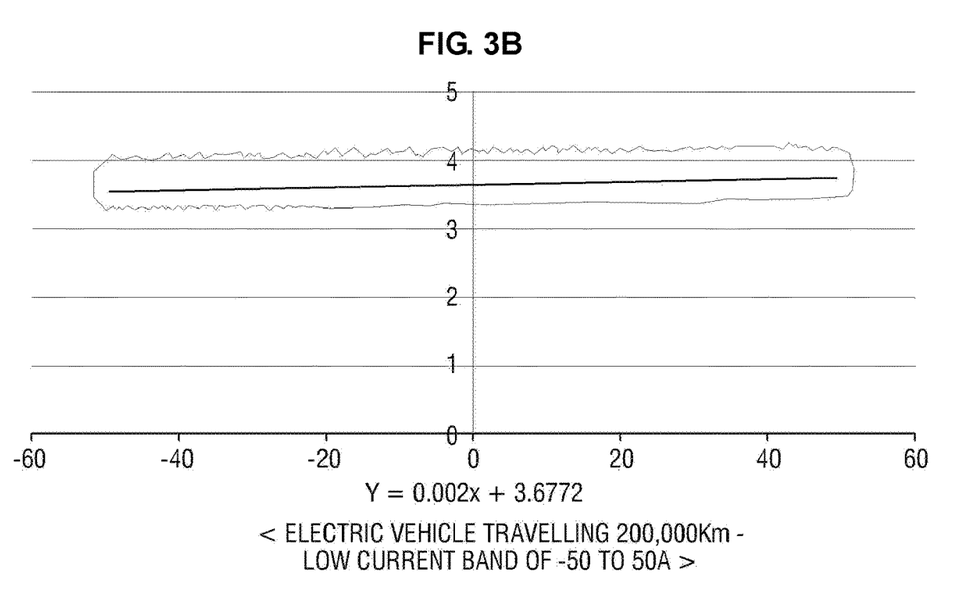
FIG. 3B illustrates a trend line of a low current band of a long-distance travelling vehicle.
Figure 3C:
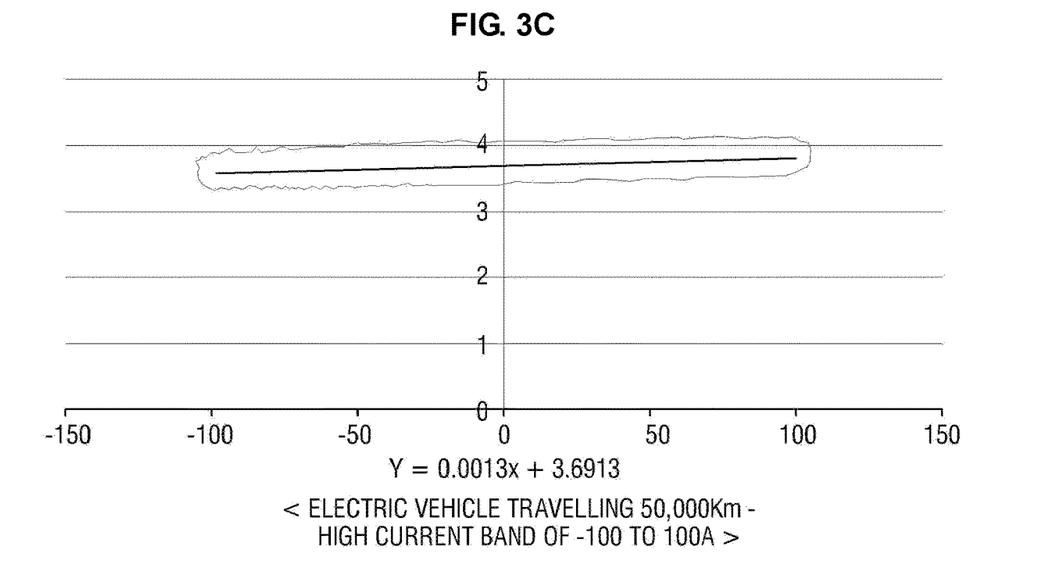
FIG. 3C illustrates a trend line of a high current band of a short-distance travelling vehicle.
Figure 3D:
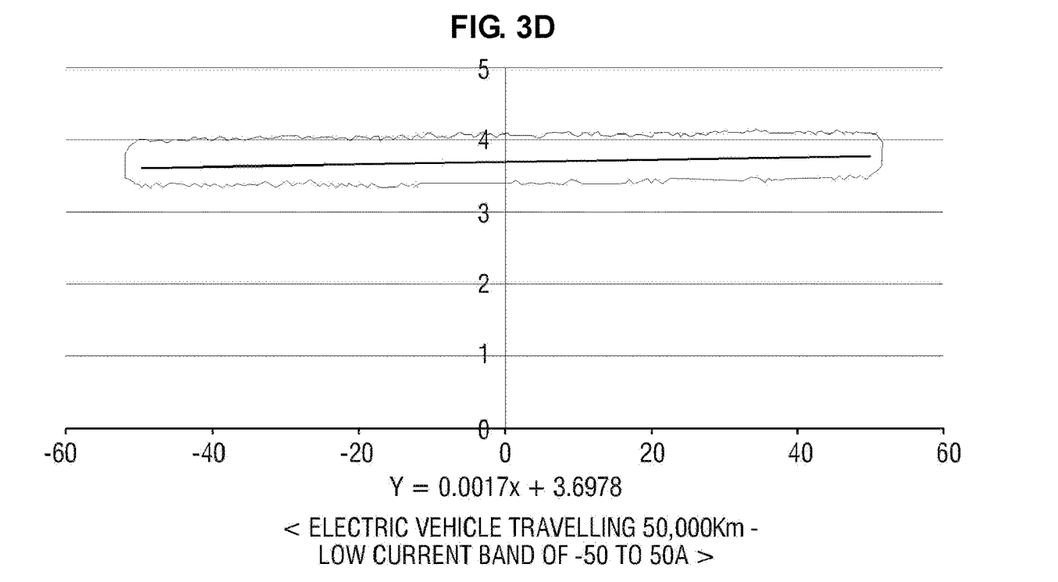
FIG. 3D illustrates a trend line of a low current band of a short-distance travelling vehicle.

FIGS. 3A to 3D illustrate examples of a trend line of an output voltage of a battery for an electric vehicle in some forms of the present disclosure. In particular, FIG. 3A is a trend line of a high current band of a long-distance travelling vehicle, FIG. 3B is a trend line of a low current band of a long-distance travelling vehicle, FIG. 3C is a trend line of a high current band of a short-distance travelling vehicle, and FIG. 3D is a trend line of a low current band of a short-distance travelling vehicle.

First, referring to FIGS. 3A and 3B, a function of a trend line in a high-current band of −100 to 100A of an electric vehicle travelling 200,000 Km is Y=0.0015x+3.6736, and a function of a trend line in a low-current band of −50 to 50A is Y=0.002x+3.6772, and according to a size of the inclination of the trend line, it can be recognized that the inclination of the trend line in the low-current band which is mainly used for operating the vehicle is larger.

Referring to FIGS. 3C and 3D, a function of a trend line in a high-current band of −100 to 100A of an electric vehicle travelling 50,000 Km is Y=0.0013x+3.6913, and a function of a trend line in a low-current band of −50 to 50A is Y=0.0017x+3.6978, and it can be recognized that the inclination of the trend line in the low-current band which is mainly used for operating the vehicle is also larger.

Accordingly, it can be seen that under the condition of the same travelling distance, when a deterioration degree is measured by using the trend line of the low-current band mainly used for operating the vehicle, rather than the trend line of the high-current band, it is possible to more accurately measure the deterioration degree of the battery.

An inclination of the trend line of the vehicle travelling 200,000 Km in the high-current band is 0.0015 and an inclination of the trend line of the vehicle travelling 50,000 Km in the high-current band is 0.0013, and an inclination of the trend line of the vehicle travelling 200,000 Km in the low-current band is 0.002 and an inclination of the trend line of the vehicle travelling 50,000 Km in the low-current band is 0.0017, and through this, it can be seen that the inclination of the trend line of the vehicle having the larger driving distance in the same current band is larger and this is because as the driving distance increases, resistance of the battery increases and the deterioration degree of the battery increases.

Figure 4:
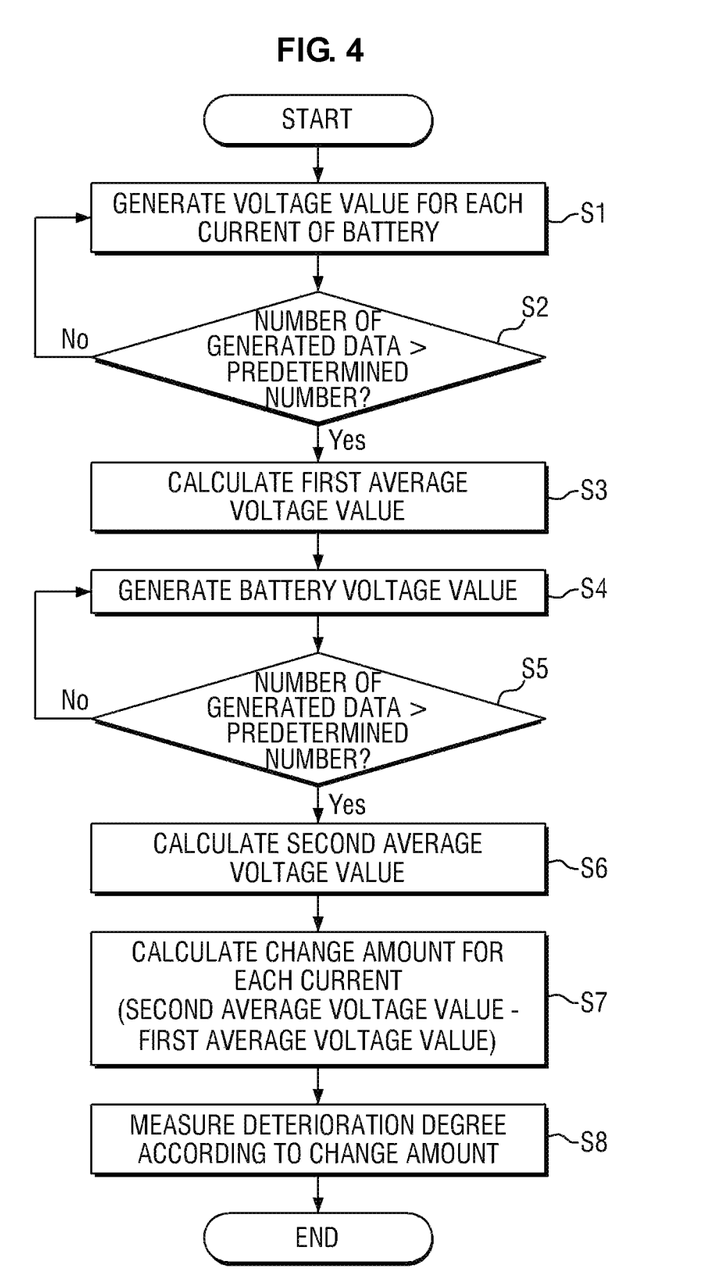
FIG. 4 is a flowchart of a method of measuring a deterioration degree of a battery for an electric vehicle according to a first exemplary form of the present disclosure.

FIG. 4 is a flowchart of the method of measuring a deterioration degree of a battery for an electric vehicle according to the first exemplary form of the present disclosure.

Referring to the drawing, as described above, the method of measuring a deterioration degree of a battery in the first exemplary form of the present disclosure calculates a deterioration degree of the battery by using a change amount representing a decrease or an increase in an average value of the voltage values, which will be described in detail below.

The method of measuring a deterioration degree according to the first exemplary form of the present disclosure is performed by the BMS of the electric vehicle, and first, the BMS measures voltage values of the battery at respective current value points belonging to a preset output current value section of the battery and generates voltage value data (S1).

Then, the BMS determines whether the number of generated voltage value data is larger than a predetermined number (S2).

In the first exemplary form of the present disclosure, the output current value section of the battery is set to −50A to 50A mainly used for operating the vehicle, and the predetermined number of the data of the voltage value is set to 100.

As a result of the determination, when the number of generated voltage value data is larger than the predetermined number, the BMS calculates a first average voltage value ($V\_avg(t)$) of the voltage value data obtained at the respective current value points at a first time point (t) at which the number of generated voltage value data is larger than the predetermined number (S3).

Subsequently, the BMS measures a voltage value of the battery at each current value point again and generates voltage value data (S4), determines whether the number of generated voltage value data is larger than the predetermined number (S5), and when the number of generated voltage value data is larger than the predetermined number, the BMS calculates a second average voltage value ($V\_avg(t+1)$) of the voltage value data obtained at each current value point at a second time point (t+1) at which the number of generated voltage value data is larger than the predetermined number (S6).

For example, in the method of measuring a deterioration degree of a battery according to the first exemplary form of the present disclosure, the section of the output current value of the battery is the section of −50A and +50A, and an average value at the first time point (t) at which the number of generated voltage value data obtained at the respective current value points of −50A, −40A, −30A, −20A, −10A, 10A, 20A, 30A, 40A, and 50A in the corresponding section is larger than the predetermined number may be indicated with $V\_avg\_-50(t)$, $V\_avg\_-40(t)$, $V\_avg\_-30(t)$, $V\_avg\_-20(t)$, $V\_avg\_-10(t)$, $V\_avg\_+10(t)$, $V\_avg\_+20(t)$, $V\_avg\_+30(t)$, $V\_avg\_+40(t)$, and $V\_avg\_+50(t)$, and the average value at the second point (t+1) may be indicated with $V\_avg\_-50(t+1)$, $V\_avg\_-40(t+1)$, $V\_avg\_-30(t+1)$, $V\_avg\_-20(t+1)$, $V\_avg\_-10(t+1)$, $V\_avg\_+10(t+1)$, $V\_avg\_+20(t+1)$, $V\_avg\_+30(t+1)$, $V\_avg\_+40(t+1)$, and $V\_avg\_+50(t+1)$.

Next, the BMS computes a difference between the second average voltage value ($V\_avg(t+1)$) and the first average voltage value ($V\_avg(t)$) of the voltage value data obtained at the respective current value points and calculates a change amount of the average voltage value (S7), and reads a deterioration level value matched with the corresponding change amount by referring to the data table, in which the deterioration level value corresponding to the calculated change amount of the average voltage value is pre-stored, and measures a deterioration degree of the battery in a current state (S8).

The deterioration degree according to a pattern of the change amount at each current value point may be mapped in the data table, and the BMS compares a pattern of the measured change amount at each current value point with the pattern of the change amount pre-stored in the data table, reads a deterioration level value of the pattern of the change amount having the most similar pattern to the pattern of the measured change amount, and measures deterioration degree information.

According to the method of measuring the deterioration degree of the first exemplary form of the present disclosure, it is possible to recognize the deterioration degree of the battery, thereby efficiently managing a life of the battery of the vehicle, and enable an Electronic Control Unit (ECU) of the vehicle to inform a user of a possible driving distance to which the recognized deterioration degree of the battery is reflected, thereby improving a commercial value of the vehicle and preventing consumer complaints.

Figure 5:
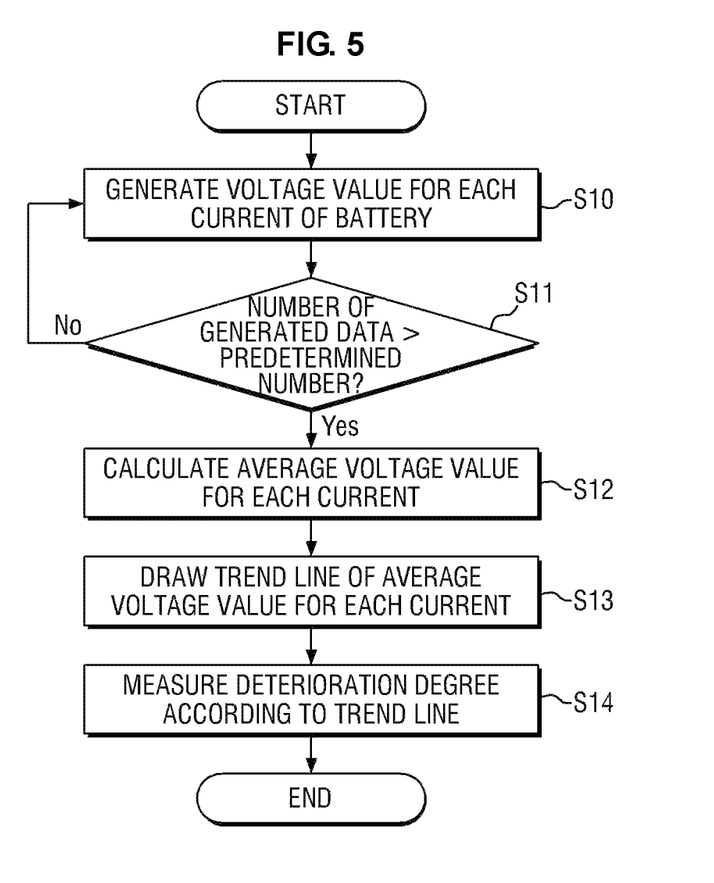
FIG. 5 is a flowchart of a method of measuring a deterioration degree of a battery for an electric vehicle according to a second exemplary form of the present disclosure.

FIG. 5 is a flowchart of the method of measuring a deterioration degree of a battery for an electric vehicle according to the second exemplary form of the present disclosure.

Referring to the drawing, as described above, the method of measuring a deterioration degree of a battery according to the second exemplary form of the present disclosure calculates an average value of the voltage values measured at each current value point of the battery and drawing a trend line of the calculated average values of the voltage values, and calculating a deterioration degree by using an inclination of the drawn trend line, which will be described in detail.

The method of measuring a deterioration degree according to the second exemplary form of the present disclosure is performed by the BMS of the electric vehicle, and first, the BMS measures voltage values of the battery at respective current value points belonging to a preset output current value section of the battery and generates voltage value data (S10).

Then, the BMS determines whether the number of generated voltage value data is larger than a predetermined number (S11).

In the second exemplary form of the present disclosure, the output current value section of the battery is set to −50A to 50A mainly used for operating the vehicle, and the predetermined number of the data of the voltage value is set to 100.

As a result of the determination, when the number of generated voltage value data is larger than the predetermined number, the BMS calculates an average voltage value (V_avg) of the voltage value data generated at the respective current value points at a corresponding time point at which the number of generated voltage value data is larger than the predetermined number (S12).

Subsequently, the BMS draws a trend line of the average voltage value by connecting the average voltage values (V_avg) of the respective current value points (S13).

For example, in the method of measuring a deterioration degree according to the second exemplary form of the present disclosure, the section of the output current value of the battery is the section of −50A and +50A, and average voltage values at the respective voltage value points at which the number of generated voltage value data obtained at the respective current value points of −50A, −40A, −30A, −20A, −10A, 10A, 20A, 30A, 40A, and 50A in the corresponding section is larger than the predetermined number may be indicated with V_avg_−50, V_avg_−40, V_avg_−30, V_avg_−20, V_avg_−10, V_avg_+10, V_avg_+20, V_avg_+30, V_avg_+40, V_avg_+50, and the BMS draws the trend line of the average voltage value like the examples illustrated in FIGS. 2 and 3 by connecting the average voltage values (V_avg) for each current point, and as described above, the drawn trend line may be considered as a component of a resistance value according to a voltage value to a current value.

Next, the BMS recognizes an inclination of the drawn trend line, and reads a deterioration level value matched to the recognized inclination by referring to the data table in which the deterioration level value corresponding to the recognized inclination is pre-stored, and measures a deterioration degree in a current state (S14).

According to the method of measuring the deterioration degree of the second exemplary form of the present disclosure, it is possible to accurately measure the deterioration degree of the battery, thereby efficiently managing a life of the battery of the vehicle, and enable an Electronic Control Unit (ECU) of the vehicle to inform a user of a possible driving distance to which the recognized deterioration degree of the battery is reflected, thereby improving a commercial value of the vehicle and preventing consumer complaints similar to the first exemplary form.

The methods of measuring the deterioration degree according to the exemplary forms of the present disclosure may vary a section of a current value for generating a voltage value according to a driving distance of a vehicle or a battery use time, and when a driving distance of the vehicle is small (for example, about 20,000 Km), a section of the current value may be minimized to a section of −20A to 20A, and as the driving distance of the vehicle increases, the section of the corresponding current value may be gradually increased, and for example, every two sections of the current value may be added when the vehicle travels every 20,000 Km or when the vehicle is used for 6 months.

The methods of measuring the deterioration degree according to the exemplary forms of the present disclosure may vary a section of a current value for generating a voltage value according to a battery charging time under a specific voltage condition, and when a charging arrival time to a specific voltage of the battery is measured during rapid charging and the charging arrival time is shorter than a pre-stored charging arrival time during rapid charging, the method may vary a section of a current value for generating a voltage value in order to calculate a State Of Health (SOH) of the battery, or when the slow charging time of the battery during slow charging is shorter than a pre-stored normal slow charging reference time, the method may vary a section of a current value for generating a voltage value in order to calculate an SOH of the battery.

The methods of measuring the deterioration degree of the exemplary forms of the present disclosure may use only the voltage values measured at the current value points at which the voltage values measured at the respective current value points is obtained by the number equal to or larger than a predetermined reference number for a predetermined time for measuring a deterioration degree.

For example, when the number of voltage values obtained at the respective current value points of −50A, −40A, −30A, −20A, −10A, 10A, 20A, 30A, 40A, and 50A in a corresponding section of the current value points is 100, 50, 40, 150, 20, 30, 300, 100, 10, and 5, respectively, and a predetermined reference number of an obtainment target is 100 or more, only the voltage values measured at the current value points of −50A, −20A, 20A, and 30A, at which 100 or more voltage values are obtained, are used for measuring a deterioration degree.

What is claimed is:

1. A method of measuring a deterioration degree of a battery of a vehicle, the method comprising:
controlling the vehicle to travel at a travelling distance, wherein travelling of the vehicle changes a deterioration degree of the battery of the vehicle;
measuring in real time during the travelling of the vehicle, by a controller of a Battery Management System (BMS), voltage values of the battery at respective current value points belonging to a predetermined output current value section of the battery and generating voltage value data;
determining in real time during the travelling of the vehicle, by the controller of the BMS, whether a number of generated voltage value data is larger than a predetermined number;
when the number of generated voltage value data is larger than the predetermined number, calculating in real time during the travelling of the vehicle, by the controller of the BMS, a first average voltage value (V_avg(t)) of the voltage value data obtained at the respective current value points at a first time point (t);
measuring in real time during the travelling of the vehicle, by the controller of the BMS, voltage values of the battery at the respective current value points again and generating voltage value data and determining whether a number of generated voltage value data is larger than the predetermined number;
when the number of generated voltage value data is larger than the predetermined number, calculating in real time during the travelling of the vehicle, by the controller of the BMS, a second average voltage value (V_avg(t+1)) of the voltage value data obtained at the respective current value points at a second time point (t+1);
calculating in real time during the travelling of the vehicle, by the controller of the BMS, a change amount of average values of the voltage values of the battery measured at the respective current value points in the predetermined output current value section;
determining in real time during the travelling of the vehicle, by the controller of the BMS, the deterioration degree of the battery based on the calculated change amount of the average values of the voltage values of the battery; and
determining in real time during the travelling of the vehicle, by the controller of the BMS, the travelling distance of the vehicle based on the determined deterioration degree of the battery,
wherein calculating in real time during the travelling of the vehicle, by the controller of the BMS, the change amount of the average values of the voltage values of the battery measured at the respective current value points in the predetermined output current value section comprises:
calculating, by the controller of the BMS, the change amount of the average voltage value based on a difference between the second average voltage value (V_avg(t+1)) and the first average voltage value (V_avg(t)), and
wherein determining in real time during the travelling of the vehicle, by the controller of the BMS, the deterioration degree of the battery based on the calculated change amount of the average values of the voltage values of the battery comprises:
measuring, by the controller of the BMS, the deterioration degree of the battery based on a deterioration level value stored in a data table corresponding to the calculated change amount of the average voltage value.

2. The method of claim 1, wherein measuring the deterioration degree includes: reading the deterioration level value corresponding to the calculated change amount of the average values from the data table in which the deterioration level value corresponding to the calculated change amount of the average voltage value is pre-stored, and measuring the deterioration degree of the battery in a current state.

3. The method of claim 1, wherein the predetermined output current value section for measuring the voltage values is varied according to a driving distance of the vehicle.

4. The method of claim 1, wherein the predetermined output current value section for measuring the voltage values is varied according to a use time of the battery.

5. The method of claim 1, wherein the predetermined output current value section for measuring the voltage values is varied according to a battery charging time to a specific condition.

6. The method of claim 1, wherein only voltage values measured at current value points at which the voltage values measured at the respective current value points are obtained by a number equal to or larger than a predetermined reference number for a predetermined time are used for measuring the deterioration degree.

7. A method of measuring a deterioration degree of a battery of a vehicle, the method comprising:
controlling the vehicle to travel at a travelling distance, wherein travelling of the vehicle changes a deterioration degree of the battery of the vehicle;
measuring in real time during the travelling of the vehicle, by a controller of a Battery Management System (BMS), voltage values of the battery at respective current value points in a predetermined output current value section and generating voltage value data;
determining in real time during the travelling of the vehicle, by the controller of the BMS, whether a number of generated voltage value data is larger than a predetermined number;
when the number of generated voltage value data is larger than the predetermined number, calculating in real time during the travelling of the vehicle, by the controller of the BMS, an average voltage value (V_avg) of the voltage value data generated at the respective current value points;
generating in real time during the travelling of the vehicle, by the controller of the BMS, a trend line by connecting average values of the measured voltage values at each current value point in the predetermined output current value section;
measuring in real time during the travelling of the vehicle, by the controller of the BMS, the deterioration degree of the battery based on an inclination of the generated trend line; and
determining in real time during the travelling of the vehicle, by the controller of the BMS, the travelling distance of the vehicle based on the measured deterioration degree of the battery,
wherein generating in real time during the travelling of the vehicle, by the controller of the BMS, the trend line by connecting the average values of the measured voltage values at the each current value point in the predetermined output current value section comprises:

generating, by the controller of the BMS, a trend line of the average voltage value by connecting the calculated average voltage values (V_avg) of the respective current value points, and wherein measuring in real time during the travelling of the vehicle, by the controller of the BMS, the deterioration degree of the battery based on the inclination of the generated trend line comprises:

measuring the deterioration degree of the battery based on a deterioration level value stored in a data table corresponding to the inclination of the generated trend line.

8. The method of claim 7, wherein generating the trend line of the average voltage value includes:

reading, by the BMS, the deterioration level value corresponding to the inclination of the generated trend line from the data table in which the deterioration level value corresponding to the inclination is pre-stored, and measuring the deterioration degree in a current state.

* * * * *